United States Patent
Love, II et al.

(10) Patent No.: US 9,232,669 B2
(45) Date of Patent: Jan. 5, 2016

(54) DATA CENTER RACK DOOR

(71) Applicant: Telect, Inc., Liberty Lake, WA (US)

(72) Inventors: Grayling A. Love, II, Liberty Lake, WA (US); Paul A. Knight, Spokane, WA (US); David Knaggs, Spokane, WA (US); Greg Hilbert, Liberty Lake, WA (US)

(73) Assignee: Telect, Inc., Liberty Lake, WA (US)

( * ) Notice: Subject to any disclaimer, the term of this patent is extended or adjusted under 35 U.S.C. 154(b) by 0 days.

(21) Appl. No.: 14/538,405

(22) Filed: Nov. 11, 2014

(65) Prior Publication Data

US 2015/0060375 A1    Mar. 5, 2015

Related U.S. Application Data

(62) Division of application No. 13/622,966, filed on Sep. 19, 2012, now abandoned.

(51) Int. Cl.
| H05K 7/20 | (2006.01) |
| E06B 9/01 | (2006.01) |
| H05K 5/02 | (2006.01) |
| E06B 9/00 | (2006.01) |
| H05K 7/14 | (2006.01) |

(52) U.S. Cl.
CPC ............... *H05K 5/0239* (2013.01); *E06B 9/00* (2013.01); *E06B 9/01* (2013.01); *H05K 5/0213* (2013.01); *H05K 7/1488* (2013.01); *H05K 7/20736* (2013.01)

(58) Field of Classification Search
CPC . H05K 5/0213; H05K 5/0239; H05K 7/1488; H05K 7/2039; H05K 7/20545; H05K 7/20127; H05K 7/20172; H05K 7/20572; H05K 7/20736; H05K 7/20536; H05K 7/20709; E06B 9/01

USPC ........... 312/210, 213, 223.2, 326, 329, 257.1, 312/109; 454/184; 174/50; 361/692, 694, 361/695; 49/40, 501; 211/26, 180; 160/352, 160/369, 371, 379

See application file for complete search history.

(56) References Cited

U.S. PATENT DOCUMENTS

| 157,037 | A | 11/1874 | Switzer |
| 618,317 | A | 1/1899 | Anderson |
| 643,149 | A | 2/1900 | McCusker |
| 669,171 | A | 3/1901 | Jefferis |
| 726,555 | A | 4/1903 | Churchill |
| 1,707,282 | A | 4/1929 | Schneider |
| 5,143,138 | A | 9/1992 | Zwart |
| 5,542,757 | A * | 8/1996 | Chang ......................... 312/223.2 |
| D377,800 | S | 2/1997 | Branz et al. |
| 6,062,663 | A | 5/2000 | You et al. |

(Continued)

OTHER PUBLICATIONS

Office Action for U.S. Appl. No. 13/622,966, mailed on Jul. 18, 2014, Grayling A. Love II et al., "Data Center Rack Door," 9 pages.

*Primary Examiner* — James O Hansen

(74) *Attorney, Agent, or Firm* — Lee & Hayes, PLLC

(57) ABSTRACT

A data center rack door having a curved permeable member is disposed vertically along a front-face of a data center rack. The curved permeable member provides an increase in surface area that provides for additional openings, increasing airflow through the data center rack. The curved permeable member also provides an increase in volume of space in the data center rack.

20 Claims, 5 Drawing Sheets

(56) References Cited

U.S. PATENT DOCUMENTS

| | | |
|---|---|---|
| 6,211,458 B1 | 4/2001 | Mitchell et al. |
| 6,378,944 B1 | 4/2002 | Weisser |
| 6,788,535 B2 | 9/2004 | Dodgen et al. |
| 7,038,124 B1 | 5/2006 | Sosnowski |
| 7,226,353 B2 | 6/2007 | Bettridge et al. |
| 7,290,842 B1 | 11/2007 | Lai |
| 7,522,414 B2 | 4/2009 | Karstens |
| D632,660 S * | 2/2011 | Donowho et al. ............ D13/184 |
| 7,978,463 B1 | 7/2011 | Haun et al. |
| 7,983,038 B2 | 7/2011 | Levesque et al. |
| 7,995,340 B2 | 8/2011 | Peter et al. |
| 8,009,430 B2 | 8/2011 | Claassen et al. |
| 8,035,965 B2 | 10/2011 | Adducci et al. |
| 8,659,905 B2 | 2/2014 | Knoop |
| 2007/0261281 A1* | 11/2007 | Roberge .................... G09F 7/04 40/600 |
| 2008/0123284 A1 | 5/2008 | Jaramillo et al. |
| 2009/0235840 A1 | 9/2009 | Early |
| 2010/0097752 A1 | 4/2010 | Doll et al. |
| 2011/0217916 A1 | 9/2011 | De Zen et al. |
| 2011/0297351 A1 | 12/2011 | Vosper et al. |
| 2012/0199542 A1* | 8/2012 | Knight ............... H05K 7/20836 211/183 |
| 2014/0077672 A1 | 3/2014 | Love, II et al. |

* cited by examiner

DATA CENTER RACK DOOR

RELATED APPLICATION

This application is a divisional of and claims priority to U.S. patent application Ser. No. 13/622,966, filed on Sep. 19, 2012, the disclosure of which is incorporated by reference herein.

BACKGROUND

Thermal management of computing equipment and devices is critical to their performance and reliability. The thermal management equipment used to keep these computing equipment and devices at a precise temperature consume large amounts of power.

Thermal management devices and methods exist for managing the temperature of a computing facility to provide an abundance of air at the right temperature for the computing equipment and devices housed within. For example, data center racks may be arranged to intake cold air at the fronts of the data center racks and exhaust hot air at the backs of the data center racks.

The effectiveness of these thermal management devices and methods are dependent upon the ability to move air through the data center racks. Doors exist that use sheet metal that is perforated to provide the ability to move air through the data center racks. However, the perforated sheet metal doors are limited to a maximum percentage of open perforated space because of the sheet metal punching process that forms the perforations. The limited perforation size reduces the perforated sheet metal door's efficiency to move air through the data center rack, thus consuming more power and costing more money. Further, because the perforated sheet metal doors are substantially flat, the perforated sheet metal doors limit the space available for the data center racks to which the perforated sheet metal doors are attached. Further, the perforated sheet metal doors are often expensive to manufacture.

Thus, there remains a need to develop new data center rack doors that move air efficiently through data center racks.

SUMMARY

This Summary is provided to introduce concepts relating to data center rack doors, which are further described below in the Detailed Description. This Summary is not intended to identify essential features of the claimed subject matter, nor is it intended for use in determining the scope of the claimed subject matter.

A data center rack door is provided that comprises a curved permeable member that exhibits an increase in airflow through data center racks, provides an increase in volume of data center racks, and has as a lower cost of production. In some embodiments, such data center rack doors may be configured to provide visibility of the equipment housed in the data center racks, and provide front and/or rear access to equipment housed in data center racks, while providing security for the equipment housed in data center racks.

In one example, a frame of the data center rack door may include a horizontal frame member having a curved surface that may define a curved front surface of the data center rack door. In another example, a frame of the data center rack door may include a plurality of horizontal frame members having a curved surface that may define the curved front surface of the data center rack door. In examples where the frame includes at least one horizontal frame member having a curved surface, a permeable member may be interposed between the curved surface of the horizontal frame member and two vertical frame members. In examples where the frame includes a plurality of horizontal frame members having a curved surface, a permeable member may be interposed between the two vertical frame members, and disposed adjacent to the curved surfaces of the plurality of horizontal frame members. In any of these examples, the permeable member may be substantially coplanar to the curved front surface of the data center rack door.

In another example, the permeable member may comprise a mesh. For example, the mesh may be a metal mesh, a plastic mesh, a composite mesh, or the like suitable to provide increased airflow, equipment visibility, security, and/or rigidity relative to perforated sheet metal doors.

In another example, the frame of the data center rack door may include a vertical frame member opposite another vertical frame member. Here, the vertical frame members may include cooperating inner and outer components, that when assembled together to form a vertical frame member, have a channel arranged between the inner and outer components. The channel may be for receiving a portion of the permeable member.

In another example, a front strip may be arranged vertically between the vertical frame members and disposed adjacent to the permeable member. The front strip may be arranged to cooperate with the horizontal frame members to retain the permeable member in the curved front surface of the data center rack door.

BRIEF DESCRIPTION OF THE DRAWINGS

The detailed description is described with reference to the accompanying figures. The use of the same reference numbers in different figures indicates similar or identical items.

DETAILED DESCRIPTION

Overview

Figure 1:
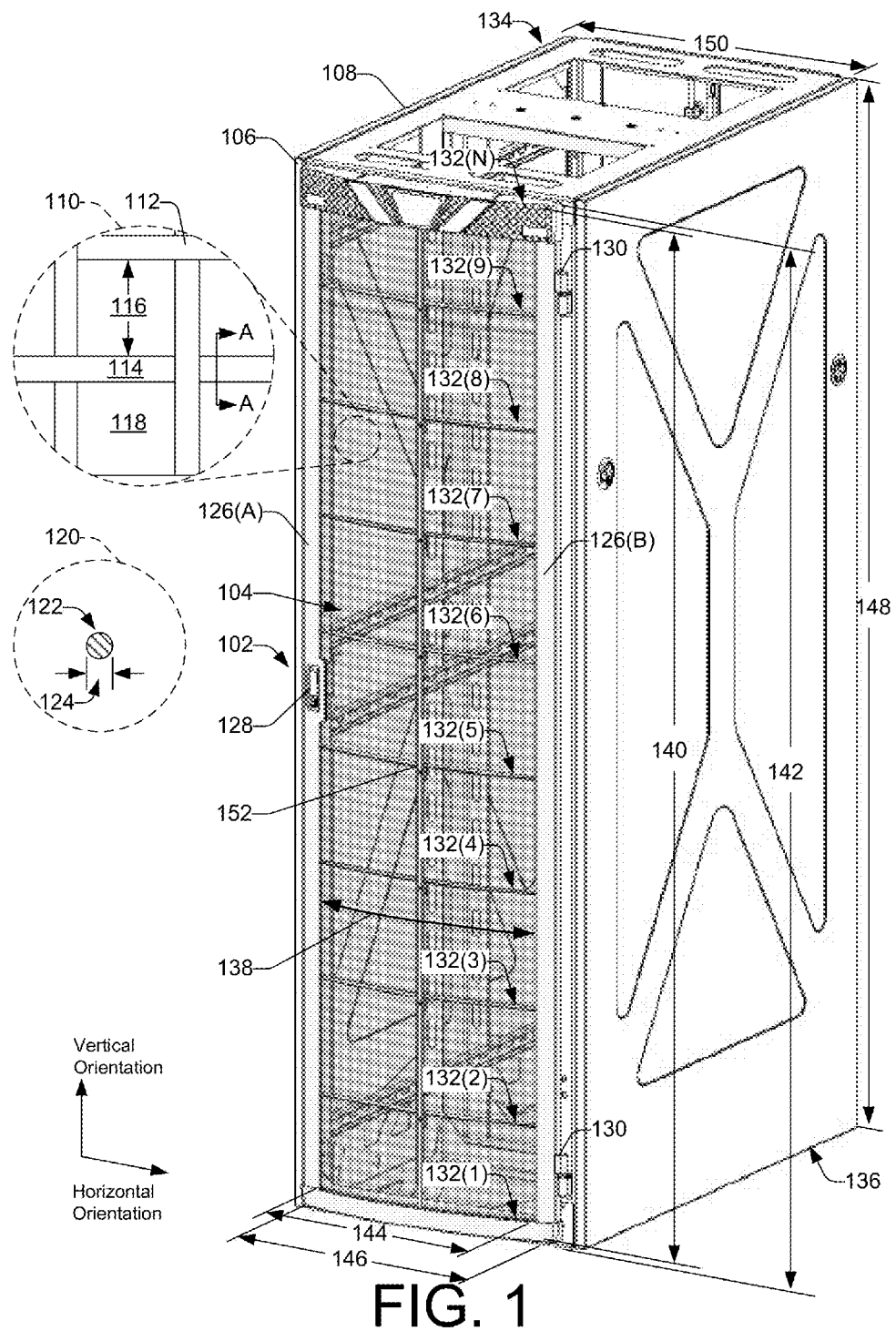
FIG. 1 illustrates a data center rack door having a curved permeable member, and disposed vertically along a front-face of a data center rack.

As discussed above, existing data center rack doors fail to adequately provide airflow through data center racks. For example, existing doors fail to adequately move air through data center racks that are inexpensive to fabricate, and that provide an increased volume of useable space in the data center racks.

This disclosure is directed to data center rack doors having a curved permeable member disposed vertically along front-faces and/or back-faces of data center racks. The curved permeable member thereby increases a surface area as compared to a flat permeable front member. The increased surface area provides for additional openings in the increased surface area. Thus, the curved permeable member increases a percentage of total area of open space per total area of closed space of a total area of the curved permeable member. The increase in open space thereby reduces an amount of energy needed to maintain a desired pressure differential across the permeable front member to provide an efficient airflow for the equipment housed in the data center racks.

Traditionally, data center rack doors have been made to be substantially flat. Because these traditional data center rack doors are flat, they do not provide any additional space in a data center rack. As such, a user must manage equipment housed in data center racks in restricted space. For example, a user may need to manage cables routed in a data center rack in front and/or in back of equipment housed in the data center racks. The space in front and/or in back of the equipment housed in the data center rack may be restricted or limited by the data center rack door, when the door is in a closed position. In some instances, the data center rack space may be restricted or limited to the point where a user may not be able to route cables or manage the equipment housed in the data center rack. Thus, data center rack space is highly valued. Accordingly, this disclosure describes data center rack doors having curved permeable members that provide increased volume of space in the data center rack when in a closed position, and therefore provide operational personnel the improved ability to manage equipment housed in data center racks while simultaneously keeping the computing equipment and devices performing optimally.

To achieve the lower cost of production, in one example this application describes a curved permeable member that is formed of a mesh. The mesh being cheaper to fabricate than fabricating perforated sheet metal. In addition to being cheaper to fabricate, the installation of the mesh requires minimal tooling making assembly less expensive and less time consuming.

The mesh may be of any suitable mesh capable of providing sufficient rigidity, increased airflow, equipment visibility, and/or security. For example, the mesh may be a metal mesh (e.g., steel mesh, aluminum mesh, iron mesh, etc.) a plastic mesh (e.g., polystyrene mesh, polyethylene mesh, polyvinyl chloride mesh, polyamide mesh, etc.), a composite mesh (e.g., carbon fiber mesh, fiberglass mesh, etc.) or the like suitable to provide sufficient rigidity, increased airflow, equipment visibility, and/or security.

In an example embodiment where the mesh comprises a metal mesh, the mesh may include precrimped wires, intercrimped wires, welded wires, flat top weave wires, or any other wire type mesh. In some examples, wire mesh may have openings of at least about 0.25 inch voids to at most about 1 inch voids. However, in other examples, the wire mesh may have openings smaller than 0.25 inch voids and/or larger than 1 inch voids. In such examples, the wire mesh may have openings of at least about 0.1 inch voids to at most about 2 inch voids. The wire mesh may have a substantially round, square, half-round, oval, triangle, or other any other cross-sectional profile. For example, the wire mesh may have a diameter or thickness of at least about 0.03 inches to at most about 0.125 inches. Because the wire mesh may be formed to include the openings and wire thickness specified above, the wire mesh provides for increased airflow, equipment visibility, security, and rigidity. For example, where the wire mesh has a diameter of about 0.125 inches and the voids in the wire mesh are about 1 inch, the open space is about 64% of the total area of the wire mesh, while the closed space is about 36% of the total area of the wire mesh.

In one example, the permeable member may be interposed between a curved surface of a horizontal frame member and two vertical frame members of a data center rack door. The curved surface and the two vertical frame members may fix the permeable member in a curvilinear shape vertically along the data center rack door. For example, the horizontal frame member may include a curved surface extending from a first end to a second end of the horizontal frame member that, when fixed between the two vertical frame members, defines a curved front surface of the data center rack door. A portion (e.g., edges) of the permeable member may be retained or housed by one or both of the two vertical frame members. The curved surface of the horizontal frame member may displace or deform the permeable member into a substantially similar curvilinear shape as the curved surface. Thus, the permeable member may be displaced or deformed to be fixed coplanar to the curved front surface of the data center rack door. The curved surface extending from the first end to the second end of the horizontal frame member may have a radius of at least about 30 inches and at most about 50 inches.

In another example, the permeable member may be interposed between a plurality of horizontal frame members having a curved surface arranged between a first end opposite a second end of the horizontal frame members. The curved surface may be substantially the same for each horizontal frame member, and the plurality of horizontal frame members may be distributed evenly from a top of the data center rack door to a bottom of the data center rack door. However, the horizontal frame members disposed at the top and/or bottom of the data center rack door may include different width than the plurality of horizontal frame members evenly distributed between the top and bottom of the data center rack door. For example, the horizontal frame members disposed at the top and/or bottom of the data center rack door may have a curved surface having a width of about 2 inches, while the plurality of horizontal frame members evenly distributed between the top and bottom of the data center rack door may have a curved surface having a width of about ⅛ inch.

The plurality of horizontal frame members evenly distributed between the horizontal frame members disposed at the top and/or bottom of the data center rack door may be defined as an array of horizontal support ribs. For example, the plurality of horizontal frame members evenly distributed between the top and the bottom of the data center rack door having a curved surface area smaller than a curved surface area of the horizontal frame members disposed at the top and/or bottom of the data center rack door may be an array of horizontal support ribs. The horizontal support ribs may be distributed vertically between the two vertical frame members and disposed adjacent to the permeable member. The plurality of horizontal support ribs may connect to the two vertical frame members via slots arranged in the vertical frame members. The plurality of horizontal support ribs may be substantially crescent shaped to further define the curved front surface of the data center rack door. For example, the horizontal support ribs may include a curved surface having substantially the same radius as the curved surface of the horizontal frame members disposed at the top and/or bottom of the data center rack door. Thus, the evenly distributed horizontal support ribs may further define the curved surface between the top of the data center rack door and the bottom of the data center rack door.

In another example, the permeable member may be retained or fixed in the curved front surface of the data center rack door by a front strip. The front strip may be arranged vertically between the two vertical frame members, and disposed adjacent to the permeable member opposite to the array of horizontal support ribs. The front strip and the array of horizontal support ribs may cooperate to retain the permeable member in the curved front surface of the data center rack door. For example, one or more of the array of horizontal support ribs may include tabs arranged to couple with cooperating fasteners disposed on the front strip, or vice versa.

Thus, when the front strip is coupled to the array of horizontal support ribs through the permeable member, the front strip on the front/outside and the array of horizontal support ribs on the back/inside cooperate to retain (e.g., clamp or sandwich) the permeable member in the curved front surface of the data center rack door.

Additionally or alternatively, a portion of the permeable member may be received by a channel arranged in one or both of the two vertical frame members. For example, the vertical frame members may include cooperating inner and outer components. The inner component may comprises a cross-sectional profile having a substantially asymmetrical S shape. The outer component may comprise a cross-sectional profile having a substantially asymmetrical U shape. A portion of the inner component may be fixed to a portion of the outer component, and a channel may be arranged between the inner and outer components to receive the portion of the permeable member. The channels may provide for sliding or displacing the permeable member along the two vertical members to install the permeable member in the data center rack door. For example, the permeable member may be slid or displaced down the vertical members, via the channels until a portion (e.g., a bottom horizontal portion) of the permeable member is flush with a portion (e.g., a bottom) of the horizontal frame member disposed at a bottom of the data center rack door, and/or flush with a portion (e.g., a top) of the horizontal frame member disposed at a top of the data center rack door. Further, one side of the permeable member may be slid or displaced down a vertical member, and the other side of the permeable member may be inserted into the other vertical member by curling or deforming the permeable member to insert the other side of the permeable member into the other vertical member.

Because these data center rack doors have a curved permeable member disposed vertically along the data center rack door, these data center rack doors provide an increased percentage of open space per closed space. By providing an increased percentage of open space, the data center rack door provides a more efficient air flow through the data center racks. Further, because these data center rack doors have a curved permeable member disposed vertically along the data center rack door, these data center rack doors provide an increased volume of space in the data center rack. By providing an increased volume of space in the data center rack, the data center rack door provides an improved ability to manage equipment housed in the data center racks.

While the illustrated embodiments show vertical frame members, horizontal frame members, horizontal ribs, and/or a front strip as being formed of a metal (e.g., a steel, an aluminum, an iron, etc.) and coated with a finish (e.g., a powder coat finish, an electroplate finish, a galvanized finish, a paint finish, etc.), other materials and/or finishes are contemplated. For example, the vertical frame members, horizontal frame members, horizontal ribs, and/or front strip may be formed of plastic, composite, or wood.

Further, while the illustrated embodiments show a door for coupling to a data center rack having dimensions of about 73 inches (42 rack units) in height, by about 24 inches, or about 28 inches, in width, other dimensions are contemplated. For example, the door may be configured to be coupled to any sized data center rack. For example, the door may be configured to be coupled to a rack having dimensions of about 38 inches (22 rack units) in height. Further, while the illustrated embodiments show a door for coupling to a front-face of the data center rack, the door may be for coupling to either the front-face and/or a back-face of the data center rack.

The term "data center" is used to describe a server room, a central office, a remote site, or any other facility housing computing equipment and/or other electronics.

The term "operational personnel" is used to describe personnel tasked with a computing facility's operation and maintenance.

The term "rack" is used to describe chassis or cabinets that provide for housing computing equipment and/or devices.

Example Data Center Rack Door

FIG. 1 illustrates a data center rack door 102 having a curved permeable member 104 disposed vertically along a front-face 106 of a data center rack 108. The curved permeable member 104 may comprise a mesh. For example, the curved permeable member 104 may comprises a metal mesh, a plastic mesh, a composite mesh, or any other suitable mesh that provides sufficient rigidity, increased airflow, equipment visibility, and/or security. In one example, detail view 110 illustrates a metal mesh 112 having mesh members 114 that are pre-crimped. The mesh members 114 may be separated by a distance 116. The separated mesh members 114 may define openings 118 arranged in the metal mesh 112. The distance 116 separating the mesh members 114, and defining the openings 118, may be any suitable dimensions to provide efficient air flow, such as those examples described above.

Detail view 110 also illustrates a section line A-A. Section line A-A is illustrated as being taken across a mesh member 114. Detail view 120 illustrates a section view of the mesh member 114 taken along section line A-A. Detail view 120 illustrates that the mesh members 114 may comprise a substantially round cross-sectional profile 122. While the detail view 120 illustrates a mesh member 114 comprising a substantially round cross-sectional profile 122, other profiles are contemplated. For example, the mesh members 114 may comprise a substantially oval cross-sectional profile, a substantially polygonal cross-sectional profile (e.g., rectangular, hexagonal, etc.), or any other profile suitable to provide for increased airflow, equipment visibility, security, and/or sufficient rigidity.

In examples where the mesh members 114 comprise a substantially round cross-sectional profile 122, airflow around the mesh members 114 may be more efficient than airflow around a rectangular cross-sectional profile. For example, the airflow around the substantially round cross-sectional profile 122 may be substantially more laminar as compared to airflow around a rectangular cross-sectional profile presented by punched sheet metal. Further, because the mesh members 114 may comprise a substantially round cross-sectional profile 122, the mesh members 114 may be arranged to have a higher percentage of openings 118 than a percentage of openings punched in sheet metal. For example, because the mesh members 114 may be arranged to have openings 118 having a distance separating the mesh members 114, the mesh members may provide for a higher percentage of openings 118 than punched sheet metal. This is because the perforated sheet metal may be limited to a maximum percentage of openings by a restricted proximity that the openings can be punched adjacent to each other without structurally compromising or causing deformations in the sheet metal. For example, the perforated sheet metal may be limited to a minimum material width (i.e., "bar width") disposed between two perforations. The minimum material width disposed between two perforations may be about three times the material thickness of the material (e.g., steel or other high-strength alloys).

The data center rack door 102 may include a vertical frame member 126(A) opposite another vertical frame member 126 (B). The vertical frame members 126(A) and 126(B) may define side portions of the frame of the data center rack door 102. The vertical frame member 126(A) may include a handle and lock assembly 128 arranged in a mortise formed in the permeable member 104. For example, vertical frame member 126(A) may include additional material having a width to provide for including an opening in the frame member 126(A) to accommodate the handle and lock assembly 128. The mortise may be formed in the permeable member 104 to align with the opening and receive a portion of the handle and lock assembly 128. The vertical frame member 126(B) may include one or more hinge assemblies 130 to pivotably couple the data center rack door 102 to the data center rack 108.

The data center rack door 102 may include a plurality of horizontal frame members 132(1), 132(2), 132(3), 132(4), 132(5), 132(6), 132(7), 132(8), 132(9), and 132(N) distributed vertically between the vertical frame members 126(A) and 126(B). The plurality of horizontal frame members 132(1)-132(N) may be substantially evenly spaced between a top 134 and a bottom 136 of the data center rack 108. The plurality of horizontal frame members 132(1)-132(N) may define a curved front surface 138 of the data center rack door 102. For example, and as discussed in more detail below with regard to FIG. 2 and FIG. 3, the plurality of horizontal frame members 132(1)-132(N) may have curved surfaces having substantially the same radius (e.g., a radius of about 42 inches in this example). Thus, when the curved permeable member 104 is installed in the data center rack door 102, the plurality of horizontal frame members 132(1)-132(N) may be arranged to be disposed adjacent to the curved permeable member 104 to define the curved front surface 138 of the data center rack door 102.

The horizontal frame member 132(1) arranged proximate to the bottom 136 of the data center rack 108 and the horizontal frame member 132(N) arranged proximate to the top 134 of the data center rack 108 may define top and bottom portions of the frame of the data center rack door 102. The two horizontal frame members 132(1) and 132(N) may have a curved surface area larger than a curved surface area of the horizontal frame members 132(2)-132(9). For example, the horizontal frame members 132(2)-132(9) may be an array of horizontal support ribs having a thin curved surface area (e.g., a width of about ⅛ inch) opposed from the horizontal frame members 132(1) and 132(N) that may have a wide curved surface area (e.g., a width of about 2 inches). This is because the two horizontal members 132(1) and 132(N) arranged proximate to the bottom 136 and top 134 of the data center rack 108 may define or establish the curved front surface 138, while the horizontal frame members 132(2)-132(9) may provide for further defining or further establishing the curved front surface 138 between the two horizontal members 132(1) and 132(N). For example, the two horizontal frame members 132(1) and 132(N) may deform the permeable member 104 proximate to the top and bottom portions of the data center rack door 102, while the horizontal frame members 132(2)-132(9) may augment the deforming of the permeable member 104 between the two horizontal members 132(1) and 132(N).

The curved permeable member 104 may have a length 140 about equal to a length 142 of the vertical frame members 126(A) and/or 126(B). The vertical frame members 126(A) and/or 126(B) may have a length about equal to a vertical height 148 of the data center rack 108. For example, the vertical height 148 of the data center rack 108 may be any standard rack height. For example, the vertical height 148 may be about 39 inches (22 rack units) to 84 inches (48 rack units) or more in height. The curved permeable member 104 may have a width 144 less than a length 146 of the plurality of horizontal frame members 132(1)-132(N). The length 146 of the plurality of horizontal frame members 132(1)-132(N) may be about the same as a width 150 of the data center rack 108 (e.g., 24 inch or about 28 inch). The curved permeable member 104 may be interposed between the curved surface(s) of one or more of the horizontal frame members 132(1)-132(N) and the vertical frame members 126(A) and/or 126(B). Because the curved permeable member 104 may be interposed between the curved surface(s) of one or more of the horizontal frame members 132(1)-132(N) and the vertical frame members 126(A) and 126(B), the permeable member 104 may be fixed substantially coplanar to the curved front surface 138.

The data center rack door 102 may include a front strip 152 arranged vertically between the vertical frame members 126(A) and 126(B), and disposed adjacent to the curved permeable member 104 opposite to the horizontal frame members 132(1)-132(N). The front strip 152 and the horizontal frame members 132(1)-132(N) may cooperate to retain the curved permeable member 104 in the curved front surface 138 of the data center rack door 102.

With the data center rack door 102 having a curved permeable member 104 disposed vertically along a front-face 106 of a data center rack 108, the curved data center rack door 102 provide an increased percentage of open space per closed space, and moves air more efficiently through the data center rack 108 as compared to a flat perforated metal door. In one example, a wire mesh having a wire diameter of about 0.0625 inches would have about 80% total open space versus a perforated door having a material thickness of about 0.0625 inches would have about 53% total open space, or about 30% less open space than the wire mesh. This is because perforated sheet metal may be limited to a minimum material width (i.e., "bar width") disposed between two perforations. For example, the perforations may need to be separated by a distance (i.e., "bar width") at least about three times the material thickness of the material, reducing the percentage of open space per closed space. In addition, with the data center rack door 102 having a curved permeable member 104 disposed vertically along a front-face 106 of a data center rack 108, the curved data center rack door 102 provides an increased volume of space in the data center rack 108. For example, the curved data center rack door 102 may provide at least about an additional 2 inches of space from the front-face 106 of the data center rack 108 to the curved permeable member 104 of the data center rack door 102. Further, with the data center rack door 102 having a curved permeable member 104 that includes mesh members 114 that may be separated by a distance 116 of at least about 0.25 inches to at most about 1 inch, the data center rack door 102 provides visibility of the equipment housed in the data center rack 108, while providing security for the equipment housed in data center rack 108.

Figure 2:
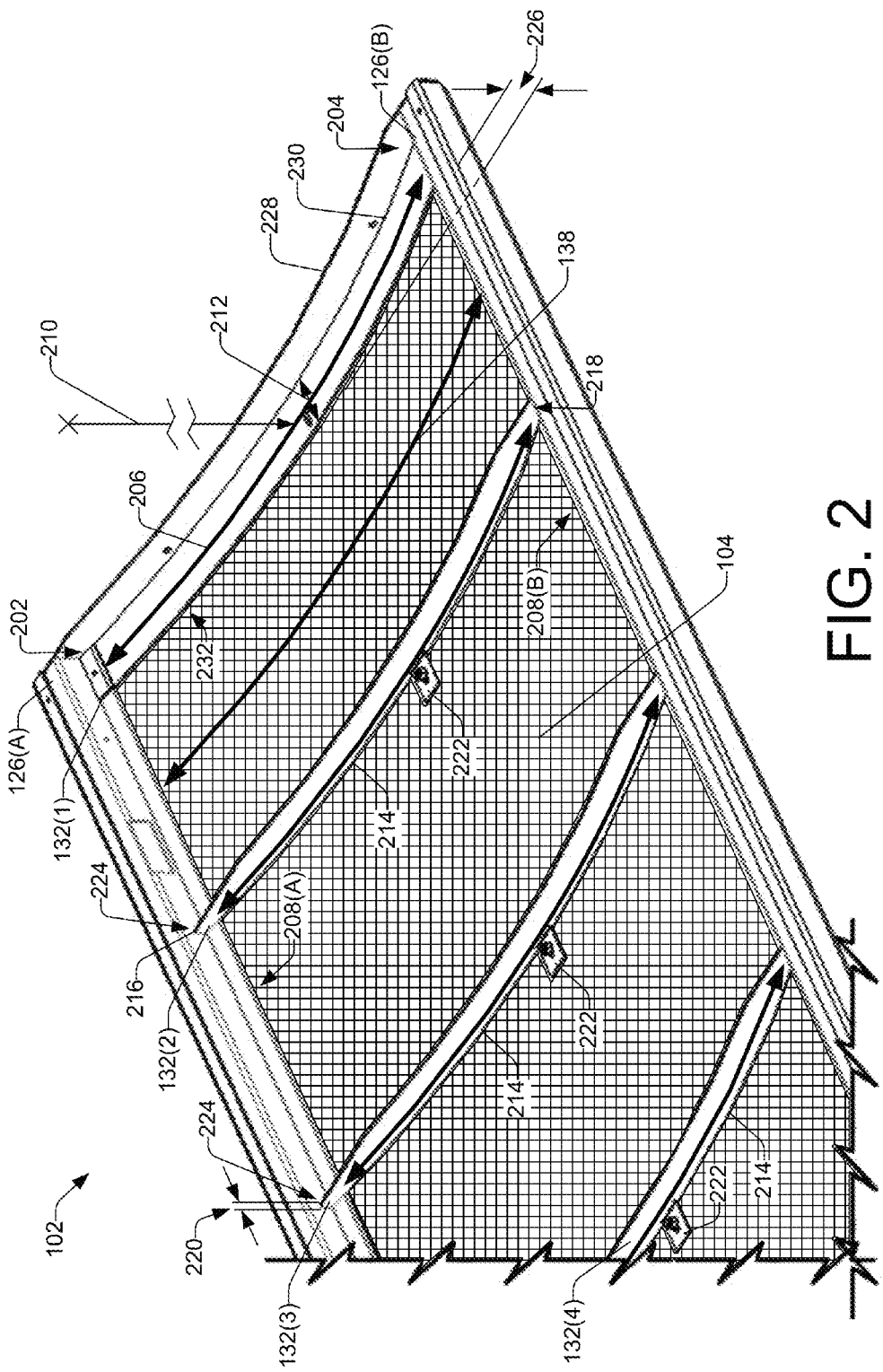
FIG. 2 illustrates a back side perspective view of the data center rack door illustrated in FIG. 1 apart from the data center rack.

FIG. 2 illustrates a back side view of the data center rack door 102 illustrated in FIG. 1. FIG. 2 illustrates the plurality of horizontal frame members 132(1), 132(2), 132(3), and 132(4) may be disposed adjacent to the curved permeable member 104 defining the curved front surface 138 of the data center rack door 102. The horizontal frame member 132(1) may include a first end 202 opposite a second end 204, and a curved surface 206 extending from the first end 202 to the second end 204. The curved horizontal frame member 132(1) may fixed between the vertical frame members 126(A) and 126(B), defining the curved front surface 138 of the data center rack door 102. For example, the curved permeable member 104 may be interposed between the curved surface 206 of the horizontal frame member 132(1) and the vertical frame members 126(A) and 126(B), and fixed substantially coplanar to the curved front surface 138. For example, the vertical frame members 126(A) and 126(B) may include channels to receive respective portions 208(A) and 208(B) (e.g., vertical edges) of the permeable member 104, while the curved surface 206 deforms or bends the permeable member 104 into a substantially similar radius as the radius of the curved surface 206. Thus, the curved permeable member 104 interposed between the curved surface 206 of the horizontal frame member 132(1) and the vertical frame members 126 (A) and 126(B) may be fixed substantially coplanar to the curved front surface 138 defined by the curved surface 206 of the horizontal frame member 132(1).

The curved surface 206 may have a radius 210 of at least about 30 inches and at most about 50 inches. The curved surface 206 may have a width 212 of about 2 inches to be disposed adjacent to the permeable member 104. The horizontal frame members 132(2)-132(9) may have a curved surface 214 having substantially the same radius 210 as the curved surface 206. The curved surface 214 may extend between a first end 216 opposite a second end 218. The curved horizontal frame members 132(2)-132(9) may be fixed between the vertical frame members 126(A) and 126(B) to further define the curved front surface 138 between the horizontal frame members 132(1) and 132(N) of the data center rack door 102. For example, the curved permeable member 104 may be further interposed between the curved surfaces 214 of the horizontal frame members 132(2)-132(9) and the vertical frame members 126(A) and 126(B) in the space between the horizontal frame members 132(1) and 132(N). The curved surfaces 214 may have a width 220 of about ⅛ inch to be disposed adjacent to the permeable member 104.

The curved horizontal frame members 132(2)-132(9) may include fastening mechanisms 222 to provide for retaining the permeable member 104 in the curved front surface 138 of the data center rack door 102. For example, the curved horizontal frame members 132(2)-132(9) may include tabs that provide for coupling the front strip 152 to the curved horizontal frame members 132(2)-132(9) through the permeable member 104. The coupled front strip 152 and curved horizontal frame members 132(2)-132(9) may retain the permeable member 104 in the curved front surface 138 of the data center rack door 102. The first and second ends 216 and 218 of the curved horizontal frame members 132(2)-132(9) may be received by apertures 224 (e.g., slots, notches, indentations, grooves, pockets, etc.) formed in the vertical frame members 126(A) and 126(B). Further, the first and second ends 216 and 218 of the curved horizontal frame member 132(2)-132(9) may be welded to the vertical frame members 126(A) and 126(B).

Because the horizontal frame members 132(1)-132(N) may include curved surfaces 206 and/or 214 having a radius 210 of at least about 30 inches and at most about 50 inches, the curved permeable member 104 may be deformed or curved out from the vertical frame members 126(A) and 126(B) by a distance 226 or gap of at least about 2 inches. Thus, when the data center rack door 102 is coupled to the data center rack 108, the distance 226 provided by the curved permeable member 104 may increase a space of the data center rack 108 as compared to a flat perforated sheet metal door. For example, because the curved permeable member 104 curves out from the data center rack 108, when in the closed position, the distance 226 may provide an increase in space of the data center rack 108 by the distance 226.

The data center rack door 102 may include a bottom cap 228 fixed to a bottom edge 230 of the data center rack door 102. The bottom cap 228 may be placed over the bottom edge 230 to provide for covering a portion 232 (e.g., a horizontal edge) of the permeable member 104. The bottom cap may also cover the distance 226 or gap provided by the curved permeable member 104.

Figure 3:
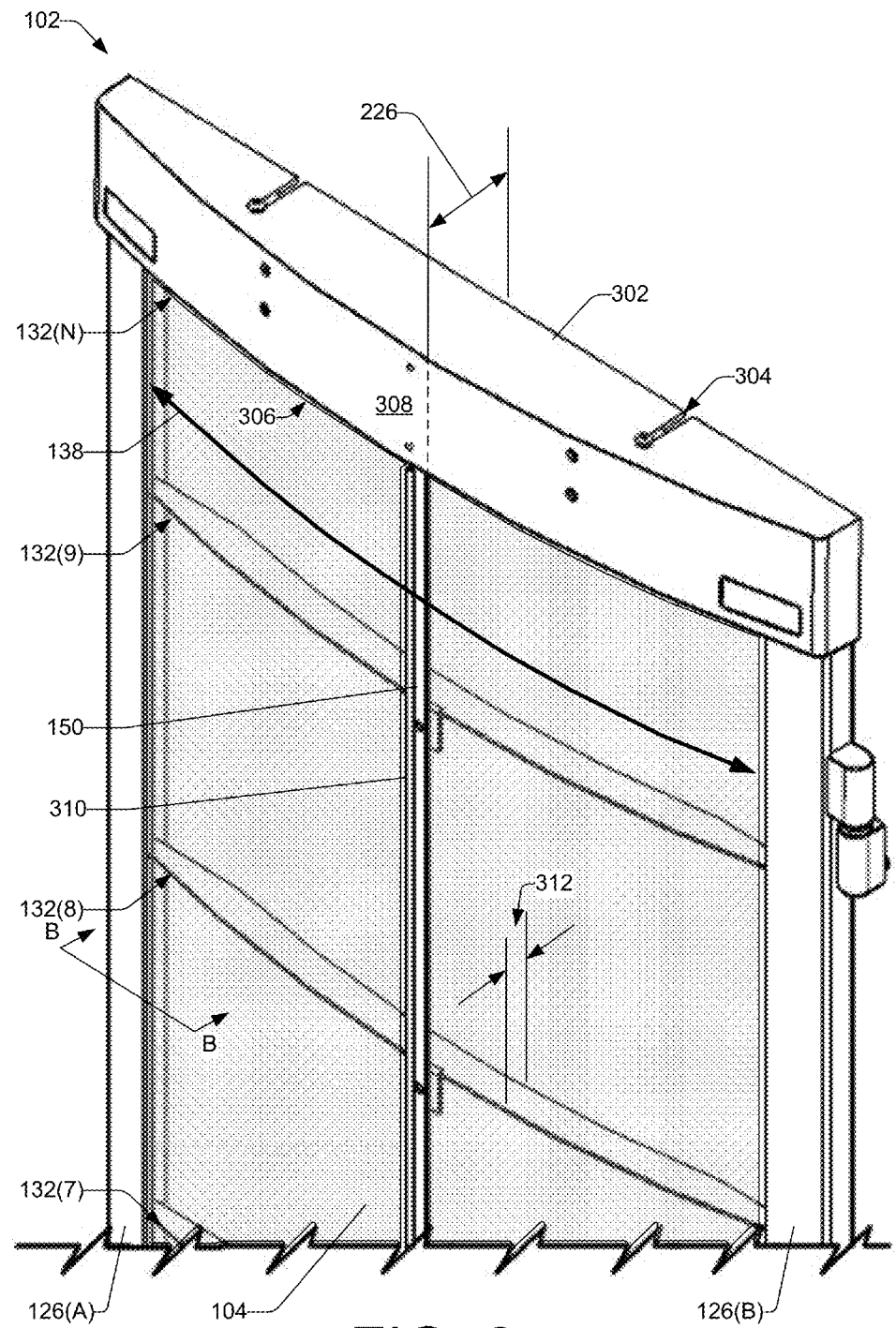
FIG. 3 illustrates a front side perspective view of the data center rack door illustrated in FIG. 1 apart from the data center rack.

FIG. 3 illustrates a front side view of the data center rack door 102 illustrated in FIG. 1. As discussed above, the plurality of horizontal frame members 132(1)-132(N) may be disposed adjacent to the curved permeable member 104 defining the curved front surface 138 of the data center rack door 102. The curved permeable member 104 may be interposed between the curved surface 206 of the horizontal frame member 132(N) and the vertical frame members 126(A) and 126(B), and fixed substantially coplanar to the curved front surface 138.

The data center rack door 102 may include a top cap 302 fixed to a top edge 304 of the data center rack door 102. The top cap 302 may be placed over the top edge 304 to provide for covering a portion 306 (e.g., a horizontal edge) of the permeable member 104. The top cap 302 may also cover the distance 226 or gap provided by the curved permeable member 104. The top cap 302 may include a surface 308 that provides a space for decorative designs, labeling, and branding. For example, the top cap 302 may have diamond tread design impressed into the surface 308, and/or two colored chevrons on either side of a trapezoidal label arranged proximate to a middle portion of the surface 308 as shown in FIG. 1.

The data center rack door 102 may include a bumper strip 310. The bumper strip 310 may be removeably coupled to the front strip 152. For example, the front strip 152 may include a v-channel, a slot, a groove, etc. to provide for receiving a cooperating portion of the bumper strip 310. The bumper strip 310 may be formed of semi-flexible material. For example, the bumper strip 310 may be formed of polyethylene, polystyrene, polyvinyl chloride, polyamide, or any other plastic that is deformable. Further, the bumper strip 310 may be formed of other materials. For example, the bumper strip may be formed of rubber, wood, fiberglass, carbon fiber, etc.

In some embodiments, the bumper strip 310 may include a thermochromic indicator. For example, the bumper strip 310 may include a thermochromic indicator this is a strip of thermochromic ink, an array of individual thermochromic marks, thermochromic paint applied to the bumper strip 310, thermochromic plastic fastened to the bumper strip 310, thermochromic labels fastened to the bumper strip 310, or the like, capable of being seen from a distance. Because the thermochromic indicator is visible from a distance it provides a visual indicator of air temperatures along substantially the entire vertical height 148 of the data center rack 108. By providing a real-time visual of air temperatures along substantially the entire vertical height 148 of the data center rack 108, the thermochromic indicator in turn provides operational personnel with the ability to see hot spots, airflow mixing, and inadequate airflow.

The horizontal frame members 132(2)-132(9) may have a depth 312 of about 1.5 inches. The depth 312 of the frame members 132(2)-132(9) may provide a high strength/rigidity to the door as compared to smaller frame members. FIG. 3 also illustrates a section line B-B. Section line B-B is illustrated as being taken across vertical frame member 126(A).

Figure 4:
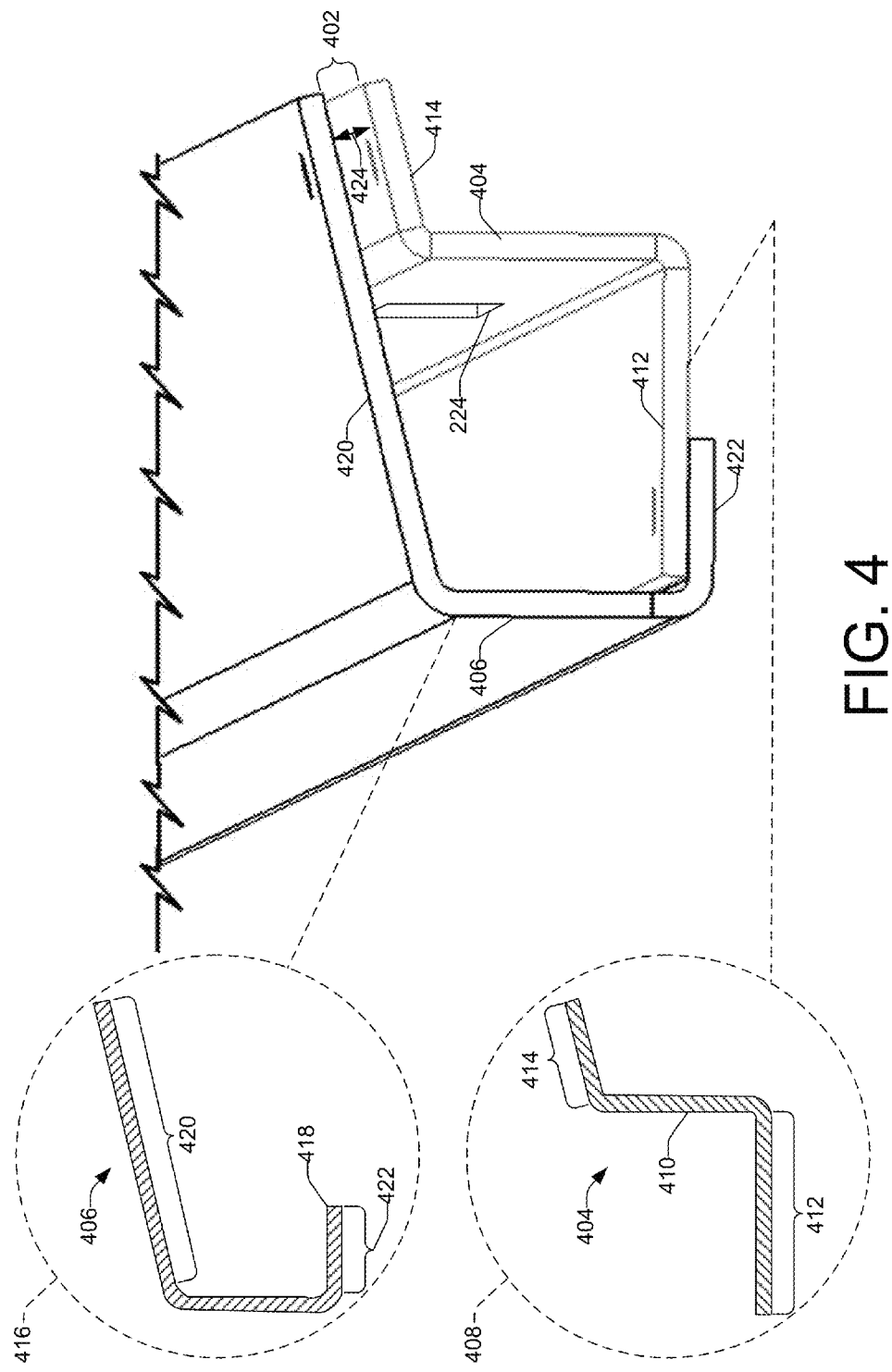
FIG. 4 illustrates a detail section view of a vertical frame member illustrated in FIG. 3.

FIG. 4 illustrates a section view of the vertical frame member 126(A) taken along section line B-B, illustrated in FIG. 3. FIG. 4 illustrates that the vertical frame members 126(A) and 126(B) may include a channel 402 to receive an edge (i.e., portion 208(A) or 208(B)) of the permeable member 104. The vertical frame members 126(A) and 126(B) may include an inner component 404 and an outer component 406. In one example, detail view 408 illustrates the inner component 404 may comprise a cross-sectional profile 410 having a substantially asymmetrical S shape. The asymmetrical S shape may include a flange 412 wider than another flange 414. The inner component 404 may include the apertures 224 (e.g., slots, notches, indentations, grooves, pockets, etc.) formed in the inner component 404.

In another example, detail view 416 illustrates the outer component 406 may comprise a cross-sectional profile 418 having a substantially asymmetrical U shape. The asymmetrical U shape may include a flange 420 wider than another flange 422.

The outer component 406 may be fixed around the inner component 404. For example, the other flange 422 of the outer component 406 may be welded to a portion of the flange 412 of the inner component 404. After the outer component 406 and inner component 404 are assembled together, the flange 420 of the outer component 406 may be disposed above the other flange 414 of the inner component 404, and define the channel 402.

The flange 420 may be arranged to be substantially parallel to the other flange 414. The flanges 420 and 414 may be separated by a distance 424 of about the same as a thickness of the permeable member 104. For example, the permeable member may be at least about 0.03 inches thick to at most about 0.3 inches thick, and the channel 402 may have a distance 424 slightly larger than at least about 0.03 inches to at most about 0.3 inches to receive and clamp the permeable member 104. For example, the distance 424 may be at least about 0.06 inches to at most about 0.8 inches.

The channel 402 may provide for displacing or sliding the permeable member 104 into the front of the data center rack door 102. For example, the permeable member 104 may be displaced or slid down substantially the entire length 142 of the vertical frame members 126(A) and 126(B) until the portion 232 (i.e., bottom horizontal edge of the permeable member 104) is flush with a bottom edge of the bottom horizontal frame member 132(1), and the portion 306 (i.e., top horizontal edge of the permeable member 104) is flush with a top edge of the top horizontal frame member 132(N).

Example Method of Manufacturing Data Center Rack Doors

Figure 5:
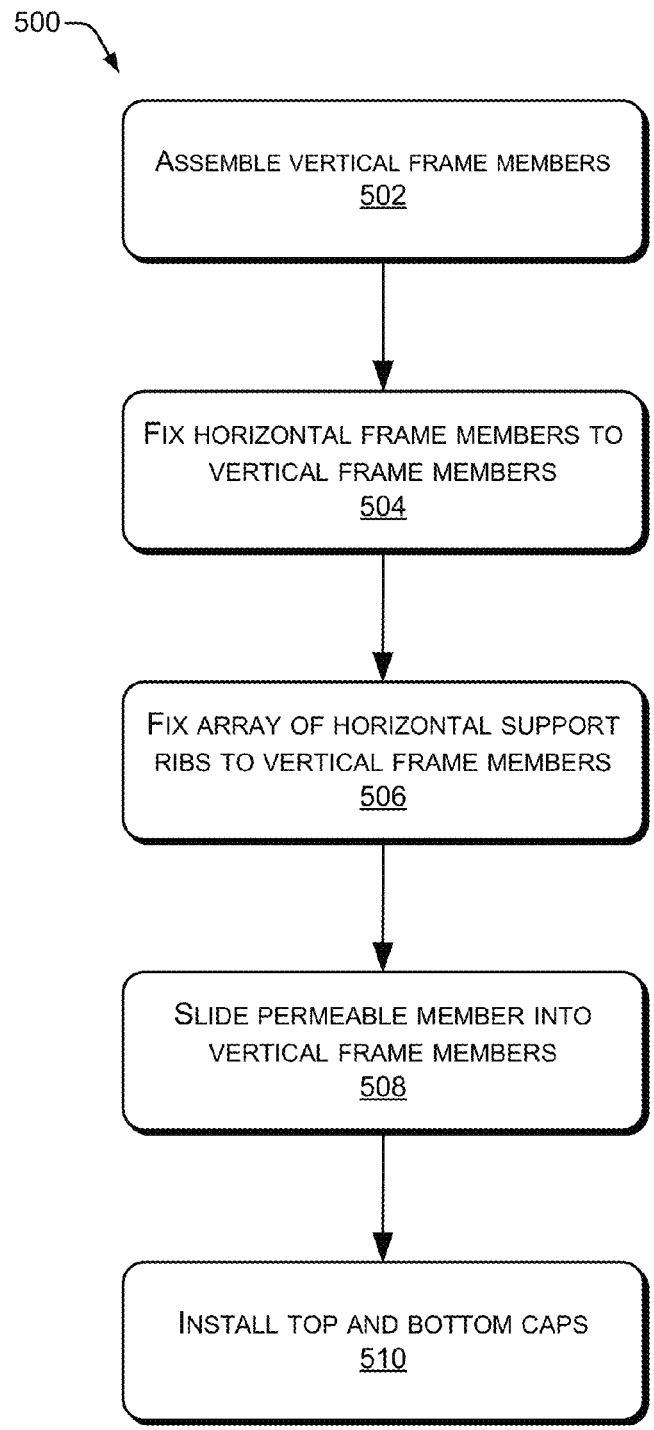
FIG. 5 is a flow diagram illustrating an example process of manufacturing a data center rack door.

FIG. 5 illustrates an example process 500 of manufacturing a data center rack door (e.g., data center rack door 102) having a curved permeable member (e.g., curved permeable member 104). By way of example and not limitation, this process may be performed at a manufacturing facility, a plant, a foundry, a factory, or the like. Some or all operations may be performed onsite in a customer facility.

Process 500 includes operation 502, which represents assembling vertical frame members (e.g., vertical frame members 126(A) and 126(B)). For example, an outer component (e.g., outer component 406) may be fixed (e.g., welded) to an inner component (e.g., inner component 404). The assembled vertical frame members may include a channel (e.g., channel 402) to receive vertical edges (e.g., portions 208(A) and 208(B)) of the permeable member.

Operation 502 may be followed by operation 504, which represents fixing horizontal frame members (e.g., horizontal frame members 132(1) and 132(N)) to the vertical frame members. For example, the horizontal frame members may be fixed to a top and bottom of the data center rack door.

Process 500 may include operation 506, which represents installing an array of horizontal support ribs (e.g., horizontal frame members 132(2)-132(9)). For example, horizontal frame members may be fixed between the vertical frame members via apertures (e.g., apertures 224) formed in the vertical frame members.

Operation 506 may be followed by operation 508, which represents displacing or sliding the permeable member into the front of the data center rack door. For example, the permeable member may be displaced or slid down substantially an entire length (e.g., length 142) of the vertical frame members until a bottom horizontal edge (i.e., portion 232) of the permeable member is flush with a bottom edge of the bottom horizontal frame member (e.g., horizontal frame member 132(1)), and a top horizontal edge (e.g., portion 306) of the permeable member is flush with a top edge of the top horizontal frame member (e.g., horizontal frame member 132(N)).

Process 500 may be completed with operation 510, which represents installing a bottom cap (e.g., bottom cap 228) and a top cap (e.g., top cap 302) to the data center rack door. For example, the bottom cap may be fixed to a bottom edge (e.g., bottom edge 230) of the data center rack door to cover the bottom horizontal edge of the permeable member, and the top cap may be fixed to a top edge (e.g., top edge 304) of the data center rack door to cover the top horizontal edge of the permeable member.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A data center rack comprising:
    a rack for removably receiving data center equipment; and
    a door coupled to the rack to protect the data center equipment, the door comprising:
        a frame comprising:
            a top horizontal member and a bottom horizontal member,
            a first vertical frame member fixed to a first end of the top horizontal member and fixed to a first end of the bottom horizontal member, and a second vertical frame member fixed to a second end of the top horizontal member and to a second end of the bottom horizontal member; and
            a plurality of horizontal support ribs distributed vertically between the top horizontal member and the bottom horizontal member;
        a permeable member having a curved surface extending from the first vertical frame member to the second vertical frame member, and
        a front strip arranged between the first vertical frame member and the second vertical frame member, the front strip coupling to the plurality of horizontal support ribs with one or more fastening mechanism that extend through the permeable member such that the permeable member is sandwiched between the front strip and the plurality of horizontal support ribs to form the curved surface of the permeable member.

2. The data center rack of claim 1, wherein each of the first and second vertical frame members includes a channel to receive an edge of the permeable member.

3. The data center rack of claim 1, wherein the sandwiching of the front strip and the plurality of horizontal support ribs retains the permeable member forming a curved front surface of the door.

4. The data center rack of claim 1, further comprising a plurality of apertures arranged on the first vertical frame member for receiving ends of the plurality of horizontal support ribs.

5. The data center rack of claim 1, wherein the fastening mechanism couples to a tab extending from at least one of the plurality of horizontal support ribs.

6. A data center rack comprising:
a rack for receiving data center equipment; and
a door coupled to the rack to secure the data center equipment, the door comprising:
  a top horizontal member and a bottom horizontal member;
  a first vertical frame member coupled to the top horizontal member and the bottom horizontal member and a second vertical frame member coupled to the top horizontal member and the bottom horizontal member, each of the first and second vertical frame members comprising:
    a channel formed by a first vertical component with a cross-sectional profile having a substantial S-shape and a second vertical component with a cross-sectional profile having a substantially asymmetrical U-shape,
    the asymmetrical U-shape having a first, longer flange spaced apart from a first flange of the S-shape to form the channel, and the asymmetrical U-shape having a second, shorter flange coupled to a second flange of the S-shape; and
  a permeable member coupled to the first vertical frame member and the second vertical frame member.

7. The data center rack of claim 6, wherein the permeable member comprises a first edge disposed in the channel of the first vertical frame member and a second edge disposed in the channel of the second vertical frame member.

8. The data center rack of claim 6, wherein the permeable member has a thickness that is substantially less than a thickness of the channel of the first vertical frame member and the channel of the second vertical frame member.

9. The data center rack of claim 6, wherein the permeable member comprises a wire mesh.

10. The data center rack of claim 9, wherein the wire mesh comprises wires having a substantially round cross-section.

11. The data center rack of claim 9, wherein the wire mesh comprises precrimped wires, intercrimped wires, welded wires, or flat top weave wires.

12. The data center rack of claim 9, wherein the wire mesh comprises wires having a thickness of at least about 0.03 inches to at most about 0.1 inches.

13. The data center rack of claim 9, wherein the wire mesh comprises wires separated by a distance of at least about 0.1 inches to at most about 1.5 inches.

14. The data center rack of claim 6, wherein the permeable member has an open surface area comprising at least 80% of a total surface area of the permeable member.

15. The data center rack of claim 6, wherein the second, shorter flange of the asymmetrical U-shape of the second vertical component is welded to the second flange of the S-shape of the first vertical component.

16. A data center rack with improved airflow management comprising:
a rack for receiving data center equipment; and
a door coupled to the rack, the door comprising:
  a frame comprising:
    a top horizontal member and a bottom horizontal member;
    a first vertical frame member coupled to the top horizontal member and to the bottom horizontal member and a second vertical frame member coupled to the top horizontal member and the bottom horizontal member;
  and
    a plurality of curved horizontal support ribs disposed between the top horizontal member and the bottom horizontal member;
  a permeable member disposed between the top horizontal member and the bottom horizontal member, and
  a front strip arranged between the first vertical frame member and the second vertical frame member, the front strip coupled to at least one of the plurality of horizontal support ribs through the permeable member, the front strip comprising a thermochromic indicator.

17. The data center rack of claim 16, wherein the thermochromic indicator comprises a thermochromic ink that changes colors in response to a change in temperature.

18. The data center rack of claim 16, wherein the front strip further comprises a mounting strip fixed to a front of the permeable member and the thermochromic indicator is removably coupled to the mounting strip.

19. The data center rack of claim 16, wherein each of the curved horizontal support ribs comprises a curve having a radius of at least about 30 inches and at most about 50 inches.

20. The data center rack of claim 16, wherein the permeable member is pinched by the plurality of curved horizontal support ribs and the front strip, forming the permeable member into a curved permeable member.

* * * * *